United States Patent [19]

Winston

[11] 4,161,790
[45] Jul. 17, 1979

[54] PROGRAMMABLE MODULAR ELECTRONIC REGISTER AND METHOD OF IMPLEMENTING SAME

[75] Inventor: Eric Winston, Melrose Park, Pa.

[73] Assignee: Jerrold Electronics Corporation, Hatboro, Pa.

[21] Appl. No.: 889,953

[22] Filed: Mar. 24, 1978

[51] Int. Cl.² .................... G11C 17/00; G11C 17/06; G11C 5/04
[52] U.S. Cl. ...................................... 365/94; 365/52; 365/63
[58] Field of Search ....................... 365/52, 63, 94, 96

[56] References Cited

U.S. PATENT DOCUMENTS

| 3,011,156 | 11/1961 | MacPherson | 365/52 |
| 3,147,461 | 9/1964 | Mondschein | 365/96 |
| 3,396,358 | 8/1968 | Ballard et al. | 339/18 |

*Primary Examiner*—Stuart N. Hecker
*Attorney, Agent, or Firm*—Hopgood, Calimafde, Kalil, Blaustein & Lieberman

[57] ABSTRACT

A programmable multi-digit register loads plural bits of fixed binary information, represented by a pattern of short or open circuit connections, onto a printed electronic circuit board or the like. A modular, plural-bit generally trapazoidal shaped metallic blank is formed having first and second facing legs connected by links in one-to-one correspondence with the bits-per-module. One leg is scored at each link, and each leg has tabs insertable in circuit board apertures.

In use, each register module is bent and soldered in place in a circuit board via the tabs, and one end of each link isolated by cutting through the score lines. The individual binary digits are then programmed into the module by selectively severing the links.

6 Claims, 6 Drawing Figures

U.S. Patent    Jul. 17, 1979    4,161,790
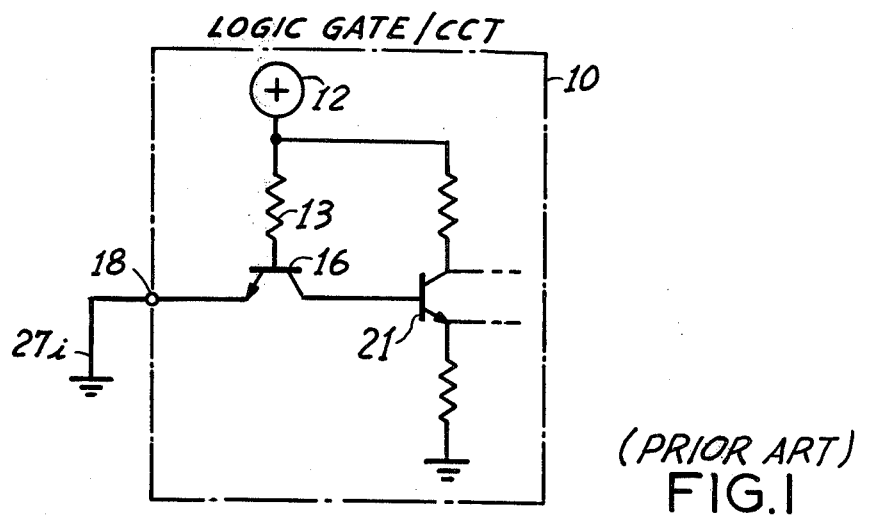
(PRIOR ART)
FIG.1
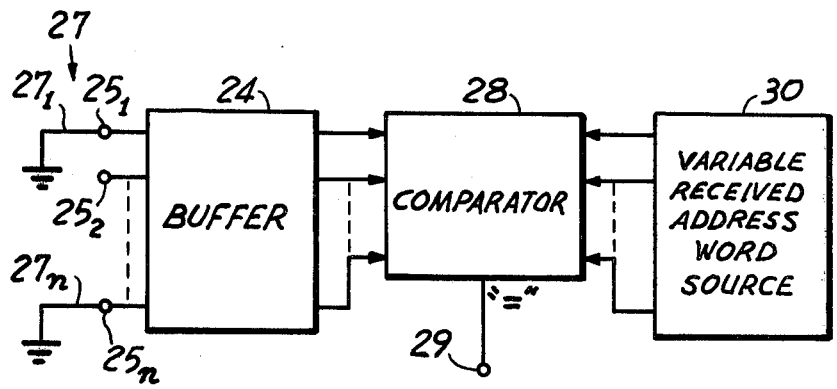
(PRIOR ART)
FIG.2
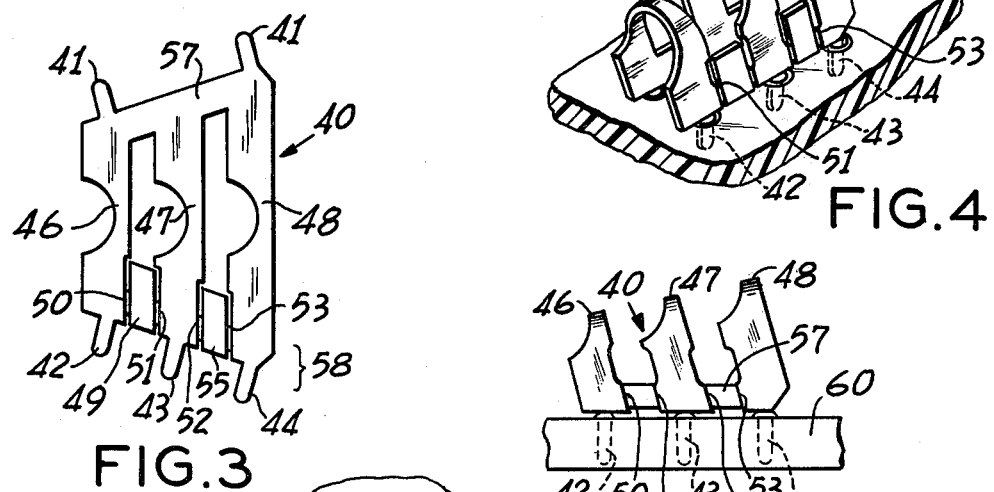
FIG.3
FIG.4
FIG.5
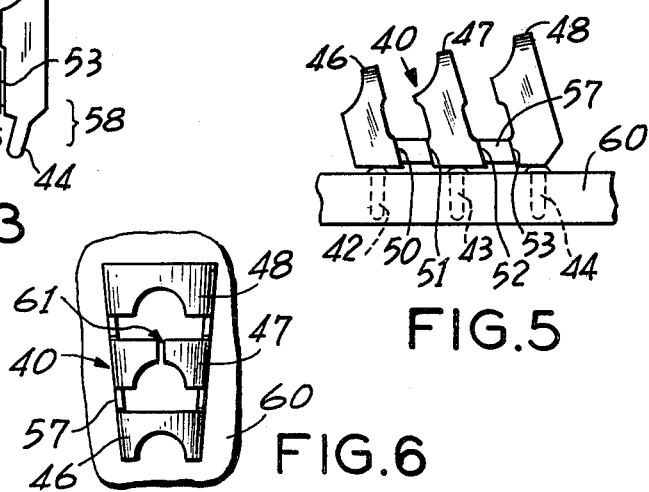
FIG.6

PROGRAMMABLE MODULAR ELECTRONIC REGISTER AND METHOD OF IMPLEMENTING SAME

DISCLOSURE OF THE INVENTION

This invention relates to electronics/electronic components and, more specifically, to a method and apparatus for loading a multi-digit binary word onto an electronic circuit board or the like.

It is an object of the present invention to provide an improved method and apparatus for facilitating entry of binary words into a unit of electronics equipment, e.g., to form a unique unit identification designator or "address" for remote electronic access and control.

It is a further object of the present invention to provide a fixed circuit board binary register for current sinking logic which can be readily and inexpensively formed, mounted in a printed circuit board, and programmed.

The above and other objects of the present invention are realized in specific, illustrative programmable circuit board register methodology and apparatus, as for a current sinking logic circuit application. A modular, plural-bit generally trapazoidal shaped metallic blank is formed having first and second facing legs connected by cross links in one-to-one correspondence with the bits-per-blank. One leg is scored at each link, and each leg has tabs insertable in circuit board apertures.

In use, each register module is bent and attached (e.g., soldered) in place in a circuit board via the tabs, and one side of each link isolated by cutting through the score lines. The individual binary digits are then programmed into the module by selectively severing the links.

The above and other features and advantages of the present invention will become more clear from the detailed description presented below in connection with the accompanying drawing, in which:

FIG. 1 is a schematic drawing depicting a typical input configuration for a logic circuit together with a fixed low level (binary "0") input connected thereto;

FIG. 2 is a circuit diagram depicting a particular application for a data register 27, i.e., as an address source;

FIG. 3 depicts a stamped, serrated module blank 40 from which one three bit word is formed;

FIGS. 4 and 5 illustrate the word module blank 40 as inserted in a printed circuit board; and FIG. 6 is a top view of the work register module as finally implemented.

Referring now to FIG. 1, there is shown a conventional current sinking logic gate, e.g., of transistor, transistor logic (TTL) form. In particular, current from a source 12 supplied to the base of a transistor 16 flows through the emitter to ground if a low level impedance to ground (e.g., a direct connection 27 shown in FIG. 1) is connected to a gate input terminal 18. If a high level impedance is present at gate input terminal 18, the current flows out of the collector of transistor 16 into the base of transistor 21. Thus, the on/off state of transistor 21, and that of all circuitry connected thereto, depends on the level of the impedance connected to the gate input port. Circuitry 10 is merely illustrative of the many forms of logic gates currently in use and is not per se any part of this invention. Also, TTL logic is used for purposes of illustration; the word register of the instant invention is usable with differing logic families.

It is the purpose of this invention to provide apparatus (27) whereby any selective pattern of short/open circuits may be connected to a corresponding number of logic circuit input terminals to represent an electrical word required for the particular application of the logic circuit.

One particular application for such a fixed binary word source is shown in FIG. 2 and is used, for example, for pay television to permit a common head end to disseminate commands (most fundamentally, reception enable/disable) to specific subscriber stations. Data received by each station (e.g., via a common CATV or MATV cable, over the air transmission, or the like) is serially received and stored in a variable data register 30, e.g., a shift register. The shift register stages are supplied as one set of inputs to a digital comparator 28 as are the outputs of buffer gates 24 (optional). Connected to the input terminals $25_1 \ldots 25_n$ of gates 24 is a fixed binary word unique to the receiving station. This station identity word is represented by a pattern of short circuits to ground (typically treated as a binary "0") or an open circuit (binary "1") in a word register 27. For the identity word shown in FIG. 2, the digital pattern $01 \ldots 0$ is constantly supplied to the buffer input terminals $25_1, 25_2 \ldots 25_n$. A comparator match output terminal 29 signals when the address contained in the variable data register 30 identically matches the fixed address as represented by the contents of the register 27. Upon such recognition, signaling that the following transmitted command word or the like is intended for the particular station, the appropriate receiving apparatus is enabled by the output at the match comparator output port 29.

This invention is directed to a particular way of implementing the fixed word source 27, i.e., to supply the pattern of "1's" (open circuits) and "0's" (short circuits). In particular, the objective is to supply apparatus and a procedure for implementing such a fixed word—where a different word may and typically is desired for each piece of manufactured equipment. Under such circumstances, the desired pattern of short and open circuits cannot be built into the fixed metal pattern for the printed circuit board or the like. Prior art implementations of the word register 27 have been relatively expensive, e.g., employing a relatively costly (materials or labor) ensemble of rocker switch modules, external jumpers or the like which are set in accordance with the "1" and "0" pattern for the identity word desired.

To this end, in accordance with the present invention, the word register 27 is implemented by forming a plurality of word modules each of which include a plurality of individual, separately programmable digits. For purposes of concreteness, but without loss of generality, it will be assumed that each module includes three bits (a useful choice where an octogonal address is used since $2^3 = 8$. To this end, there is formed a metallic blank 40 in the form shown in FIG. 3. The blank includes non-parallel leg members 57 and 58 separated by three cross-links 46-48 which form the individual bits. The leg 57 corresponds to the common electrical point, e.g., ground shown in FIG. 2 for one end of the selective connections to the buffer gate input terminals 25. One or more tabs 41 extend from the leg 57. The tab(s) 41 are ultimately inserted in land-surrounded hole(s) in a printed circuit board 60 or other substrate (see FIGS. 4-6) to make electrical connection to the common potential (e.g., ground, +5 volts or the like).

The other leg 58 includes an number of tabs in one-to-one correspondence with the number of independent bits to be represented by the element 40, vis, three tabs 42-44 for the assumed three bit module. Each of the tabs 42-44 extends from a different one of the bit cross links 46-48, and is employed to fit through a corresponding hole in the printed cicuit board 60. Thus, electrical connection to each of the elements 46-48 is made via the circuit board—carried land (metalized area) connected to the corresponding tab; see again FIGS. 4-6.

The leg 58 is scored (i.e., partially cut through) along the lines where it connects to each of the cross links members 46-48. Thus score line 50 is traversely disposed where leg 58 intersects link 46; score lines 51 and 52 are disposed on either side of the central link 47; and score line 53 traverses the intersection of link 58 with the link 48.

In use, the module blank 40 so formed is simply bent against the hoop stress of members 46-48 and the tabs 41-44 inserted in holes in the printed circuit board as shown in FIG. 4. At this point, the element(s) 40 (most typically, a number of elements 40 forming a multi-bit word) are secured in place on the board 60 during whatever soldering operation is employed to general connect electrical elements to the circuit board 60 (e.g., hand soldering, wave soldering, or the like). Once retained in place, the leg 58 is cut through along all of the score lines (50-53) such that the elements 49, 55 between links 46-48 (see FIG. 3) are removed. This electrically separates the end of the links 46-48 connected to tabs 42-44 (but which links 46-48 remain electrically connected together via leg 57 at this stage of circuit fabrication). Such an intermediate form of assembly is shown in FIG. 5.

In the form of FIG. 5, the equipment has a word register 27 consisting of all zeros, i.e., electrical short circuits to ground at each of the tabs 42-44. At some point, perhaps in the field, specific digits are programmed into each module 40. For example, for the pay television application above discussed a unique identity code is to be loaded into the fixed register 27. This is done by simply severing those cross links 46-48 in each module 40 where a "1" or high impedance is to be entered. See, for example, the gap 61 (FIG. 6) in the central cross link 47. The gap 61, again, is caused by simply clipping through the link 47 at the narrow, central portion thereof. The materials on either side of the loop about the cut will then separate by the hoop stress otherwise retained in the link. Thus, loading the desired pattern of digital "1's" and "0's" into the ensemble of modules 40 is effected by simply cutting through those cross links where an open circuit or high impedance is desired. If at any subsequent time an error is found or a change of identity code is desired, the two sides of any previously severed cross link may be electrically reconnected, either by jumper wire or by soldering the two portions of the link together.

The cascaded modules 40 have thus been shown by the above to provide a very inexpensive, efficient and flexible method of implementing a fixed register code—as where a plurality of otherwise like circuit components (e.g., pay television station units) are to be given a different identity.

The above described arrangement is merely illustrative of the principles of the present invention. Numerous modifications and adaptations thereof will be readily apparent to those skilled in the art without departing from the spirit and scope of the present invention.

What is claimed is:

1. In combination in an n-digit modular binary word register for insertion into a printed circuit substrate, when n is any positive integer greater than one, first and second conducting legs, n cross links connecting said first and second legs, n tabs each adapted for insertion into a printed circuit substrate aperture for effecting mechanical and electrical connection thereto, each of said or tabs being connected to said first leg and a different one of said n cross links, and at least one additional tab each adapted for insertion in a printed circuit substrate aperture for effecting mechanical and electrical connection thereto, each additional tab being connected to said second leg.

2. A combination as in claim 1, further comprising scored, indentation lines transverse said first leg about each portion of said first leg intermediate said cross links effective to mechanically isolate each of said cross links and their associated tabs from each other at said first leg when severed.

3. A combination as in claim 2, wherein each of said first and second legs are generally straight and disposed with one end of the respective legs closer together than the other end thereof.

4. The method of forming a programmable binary word in an electronic substrate having a plurality of apertures therein, comprising the steps of forming at least one conductive module blank having continuous conducting first and second legs, plural cross links joining said legs, and plural tabs, at least one of said tabs extending from said second leg and a plurality of said tabs extending from said first leg about the area of the intersections of said first leg and said cross links, bending said module blank and inserting said tabs in said substrate apertures, fixedly attaching said module and said substrate, and removing each portion of said first leg intermediate said cross links.

5. A method as in claim 4 further comprising the step of selectively severing said cross links.

6. The method of claim 4 further comprising the step of scoring said first leg intermediate the intersection of said first leg and said cross links to thereby isolate each of said cross links and the tab associated therewith at said first leg prior to mounting said module on said substrate.

* * * * *